(12) United States Patent
Antunez et al.

(10) Patent No.: US 10,930,809 B2
(45) Date of Patent: Feb. 23, 2021

(54) PHOTOVOLTAIC DEVICES WITH INCREASED EFFICIENCY AND METHODS FOR MAKING THE SAME

(71) Applicant: International Business Machines Corporation, Armonk, NY (US)

(72) Inventors: Priscilla D. Antunez, Tarrytown, NY (US); Yun Seog Lee, White Plains, NY (US); Ravin Mankad, Mumbai (IN); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/173,626

(22) Filed: Jun. 4, 2016

(65) Prior Publication Data

US 2017/0352770 A1    Dec. 7, 2017

(51) Int. Cl.
*H01L 31/0749*   (2012.01)
*H01L 31/0224*   (2006.01)

(52) U.S. Cl.
CPC .. *H01L 31/0749* (2013.01); *H01L 31/022425* (2013.01); *Y02E 10/541* (2013.01)

(58) Field of Classification Search
CPC .............. H01L 31/02; H01L 31/02008; H01L 31/0216; H01L 31/0236; H01L 31/0256;

(Continued)

(56) References Cited

U.S. PATENT DOCUMENTS

| 4,368,216 A | * | 1/1983 | Manassen ................ H01G 9/20 427/74 |
| 8,101,857 B2 | | 1/2012 | Kido et al. |

(Continued)

FOREIGN PATENT DOCUMENTS

| CN | 103178211 A | 6/2013 |
| CN | 103227286 A | 7/2013 |
| CN | 103715356 A | 4/2014 |

OTHER PUBLICATIONS

Wang et al., "Selenium as a photoabsorber for inorganic-organic hybrid solar cells", 2014, Phys. Chem. Chem. Phys. 16, All Pages. (Year: 2014).*

(Continued)

*Primary Examiner* — Daniel P Malley, Jr.
(74) *Attorney, Agent, or Firm* — Jeffrey S. LaBaw; Michael J. Chang, LLC

(57) ABSTRACT

A photovoltaic device with increased efficiency and a method for making the same. The present invention provides a photovoltaic device including: a transparent substrate; a transparent conductive electrode layer disposed on the transparent substrate; an n-type layer disposed on the transparent conductive electrode layer; a chalcogen absorber layer disposed on the n-type layer; a p-type molybdenum trioxide (MoO3) interlayer disposed on the chalcogen absorber layer; and a conductive layer disposed on the interlayer. A photovoltaic device having a superstrate configuration with the order of the layers reversed is also provided. The present invention further provides methods for making the photovoltaic devices according to the present invention.

9 Claims, 3 Drawing Sheets

(58) Field of Classification Search
CPC ....... H01L 31/04; H01L 31/18; H01L 31/186;
H01L 31/1864; H01L 31/1876; H01L
31/1892; H01L 31/206
See application file for complete search history.

(56) References Cited

U.S. PATENT DOCUMENTS

| | | | |
|---|---|---|---|
| 8,609,981 B2 | 12/2013 | Chen et al. | |
| 2006/0137735 A1* | 6/2006 | Kobayashi | G02F 1/133504 136/246 |
| 2007/0000537 A1* | 1/2007 | Leidholm | B82Y 10/00 136/252 |
| 2008/0124831 A1* | 5/2008 | Robinson | C23C 18/1229 438/84 |
| 2009/0217971 A1* | 9/2009 | Guha | H01L 31/022425 136/255 |
| 2010/0229940 A1* | 9/2010 | Basol | H01L 21/02491 136/256 |
| 2012/0118386 A1* | 5/2012 | Chen | B82Y 30/00 136/265 |
| 2012/0222742 A1* | 9/2012 | Nakagawa | H01L 31/0749 136/260 |
| 2012/0318361 A1* | 12/2012 | Teeter | H01L 31/0326 136/264 |
| 2013/0008509 A1 | 1/2013 | Subbiah et al. | |
| 2013/0048059 A1* | 2/2013 | Han | B82Y 10/00 136/252 |
| 2013/0269764 A1* | 10/2013 | Barkhouse | H01L 31/022425 136/256 |
| 2014/0144496 A1* | 5/2014 | Momose | H01L 51/4253 136/255 |
| 2014/0318609 A1 | 10/2014 | Martorell Pena et al. | |
| 2016/0005987 A1* | 1/2016 | Koposov | H01L 51/4226 136/263 |
| 2016/0013434 A1* | 1/2016 | Snaith | H01L 51/4226 136/252 |

OTHER PUBLICATIONS

J. Subbiah et al., "Combined effects of MoO3 interlayer and PC70BM on polymer photovoltaic device performance," Organic Electronics 11, pp. 955-958 (Feb. 2010).

English abstract translation of CN103715356 A, Apr. 9, 2014 by Univ Xidian.

English abstract translation of CN103227286 A, Jul. 31, 2013 by Wuhan Inst. Technology.

English abstract translation of CN103178211A, Jun. 26, 2013 by Univ Wuhan.

* cited by examiner

PHOTOVOLTAIC DEVICES WITH INCREASED EFFICIENCY AND METHODS FOR MAKING THE SAME

TECHNICAL FIELD OF THE INVENTION

The present invention relates to photovoltaic cells. More particularly, the present invention relates to chalcogen-based photovoltaic cells.

BACKGROUND OF THE INVENTION

Solar panels employ photovoltaic cells to generate current flow. When a photon hits a photovoltaic cell, the photon may be transmitted through, reflected off, or absorbed by the photovoltaic cell if the photon energy is higher than the material band gap value. This generates an electron-hole pair and sometimes heat, depending on the band structure.

A photovoltaic cell can be described in terms of its open circuit voltage ($V_{oc}$), short circuit current ($J_{sc}$) and fill factor (FF). Fill factor is the ratio of the maximum power point ($P_m$) divided by the open circuit voltage ($V_{oc}$) and short circuit current ($J_{sc}$):

$$FF = \frac{P_m}{V_{oc} J_{sc}}.$$

The fill factor is directly affected by the values of the cell's series and shunt resistance. Increasing the shunt resistance ($R_{sh}$) and decreasing the series resistance ($R_s$) will lead to a higher fill factor, thus resulting in greater efficiency, and pushing the cells output power closer towards its theoretical maximum.

There are many different materials used to fabricate photovoltaic cells such as CIGS (copper indium gallium selenide), CZTS (copper zinc tin sulfide), or organic polymers. Elemental selenium is the first semiconductor material to be used in a photovoltaic device by Charles Fritts in 1873. However, the initial efficiency was below 1%. Over the years, the best Se cell reported to date has only reached an efficiency up to 5.1% with the structure of: Glass/TiO$_2$/Se/Au.

SUMMARY OF THE INVENTION

One aspect of the present invention provides a photovoltaic device. The photovoltaic device includes: a transparent substrate; a transparent conductive electrode layer disposed on the transparent substrate; an n-type layer disposed on the transparent conductive electrode layer; a chalcogen absorber layer disposed on the n-type layer; a p-type molybdenum trioxide (MoO3) interlayer disposed on the chalcogen absorber layer; and a conductive layer disposed on the interlayer.

The present invention further provides a method for fabricating a photovoltaic device. The method includes the steps of: forming a transparent conductive electrode on a transparent substrate; forming an n-type layer on the transparent conductive electrode layer; forming a chalcogen absorber layer on the n-type layer; forming a p-type molybdenum trioxide (MoO3) interlayer on the chalcogen absorber layer; forming a conductive layer on the p-type interlayer; and annealing at a temperature, pressure, and length of time sufficient to form the structure of the photovoltaic device.

Another aspect of the present invention provides another photovoltaic device. This photovoltaic device includes: a transparent superstrate; a conductive layer disposed on the transparent superstrate; a p-type molybdenum trioxide (MoO3) interlayer disposed on the conductive layer; a chalcogen absorber layer disposed on the p-type molybdenum trioxide (MoO3) interlayer; an n-type layer disposed on the chalcogen absorber layer; and a transparent conductive electrode layer disposed on the n-type layer.

The present invention also provides another method for fabricating a photovoltaic device. This method includes the steps of: forming a conductive layer on a transparent superstrate; forming a p-type molybdenum trioxide (MoO3) interlayer on the conductive layer; forming a chalcogen absorber layer on the p-type molybdenum trioxide (MoO3) interlayer; forming an n-type layer on the chalcogen absorber layer; forming a transparent conductive electrode layer on the n-type layer; and annealing at a temperature, pressure, and length of time sufficient to form the structure of the photovoltaic device.

A more complete understanding of the present invention, as well as further features and advantages of the present invention, will be shown through the following detailed description and drawings.

DETAILED DESCRIPTION OF THE PREFERRED EMBODIMENTS

Some preferred embodiments will be described in more detail with reference to the accompanying drawings, in which the preferred embodiments of the present invention have been illustrated. However, the present invention can be implemented in various manners, and thus should not be construed to be limited to the embodiments disclosed herein. On the contrary, those embodiments are provided for the thorough and complete understanding of the present invention, and to completely convey the scope of the present invention to those skilled in the art.

Figure 1:
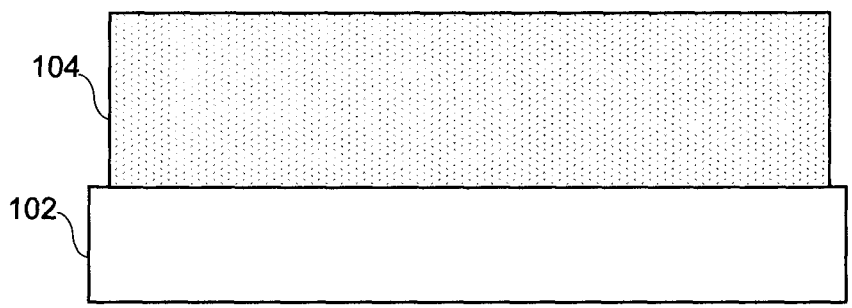
FIG. 1 is a cross-sectional diagram illustrating a transparent conductive electrode layer formed on a substrate according to an embodiment of the present invention.

Referring to FIGS. 1-5, an exemplary methodology for fabricating an improved photovoltaic device with a high work function interlayer is shown. To begin the process, as shown in FIG. 1, a substrate 102 is provided. Suitable substrate materials include, but are not limited to, glass, plastic, ceramic and metal foil (e.g., aluminum, copper, etc.) substrates.

As will be described in detail below, it has been found that employing a reflective back contact on the substrate 102 aids in increasing the efficiency of the device. A reflective back contact can be created by forming the back contact, in the manner described below, on a planar substrate (glass or metal foil substrate) or on a polished substrate. Thus, it may be desirable at this stage to polish the substrate, especially in the case of a plastic or ceramic substrate. Polishing of the substrate 102 may be carried out using any mechanical or chemical mechanical process known in the art.

A transparent conductive electrode layer 104 is then formed on the substrate. During operation, the transparent conductive electrode layer 104 is used as an electrode for low resistance electrical contacts without blocking light. According to an exemplary embodiment of the present invention, the transparent conductive electrode 104 is formed from a transparent conductive material, such as fluorine doped tin oxide (FTO), indium doped tin oxide (ITO), aluminum doped zinc dioxide (ZnO2:Al), or fluorine doped tin dioxide ($SnO_2$:F). The techniques for forming a transparent conductive electrode from these materials would be apparent to one of skill in the art and thus are not described further herein.

Figure 2:
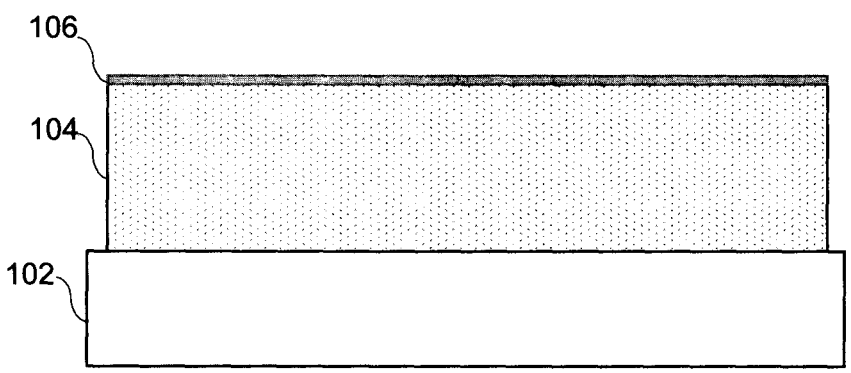
FIG. 2 is a cross-sectional diagram illustrating an n-type layer formed on the transparent conductive electrode layer according to an embodiment of the present invention.

In FIG. 2, according to an exemplary embodiment of the present invention, an n-type layer 106 is formed on the transparent conductive electrode layer 104. The n-type layer 106 can be a material such as titanium dioxide or zinc dioxide. The n-type layer 106 can be formed by depositing the respective n-type layer material on the transparent conductive electrode layer using vacuum evaporation, chemical bath deposition, electrochemical deposition, atomic layer deposition, successive ionic layer absorption and reaction (SILAR), chemical vapor deposition, sputtering, spin coating, doctor blading, physical vapor deposition or any other suitable technique that would be apparent to one of skill in the art. The n-type layer 106 can have a thickness ranging from about 2 nm to about 200 nm with a preferred thickness of about 30 nm to about 60 nm. During operation, the n-type layer 106 serves as the electron selective layer to collect electrons.

Figure 3:
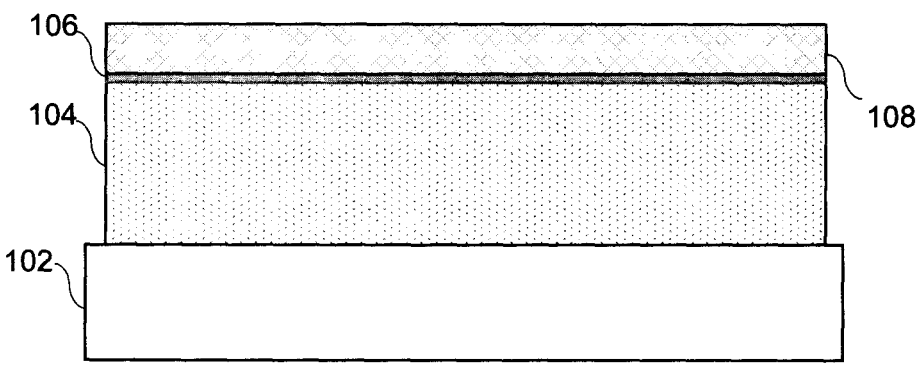
FIG. 3 is a cross-sectional diagram illustrating a chalcogen absorber layer formed on the n-type layer according to an embodiment of the present invention.

In FIG. 3, according to an exemplary embodiment of the present invention, a chalcogen absorber layer 108 is formed on the n-type layer 106. The chalcogen absorber layer can be any chalcogen such as sulfur, selenium, tellurium or any combination thereof. In various embodiments of the present invention, highly pure selenium (99.999%) is the preferred chalcogen used. The chalcogen absorber layer 108 can be deposited through vacuum evaporation, chemical bath deposition, electrochemical deposition, atomic layer deposition, successive ionic layer absorption and reaction (SILAR), chemical vapor deposition, sputtering, spin coating, doctor blading, physical vapor deposition or any other suitable technique that would be apparent to one of skill in the art. The chalcogen absorber layer 108 has a thickness from about 25 nm to about 200 nm with a preferred thickness of about 80 nm to about 120 nm.

Optionally, a tellurium adhesion layer (not shown) may be deposited on the n-type layer 106 before deposition of the chalcogen absorber layer 108. The thickness of the tellurium adhesion layer is very small, for example, about 1 nm and improves the adhesion between the n-type layer 106 and the chalcogen absorber layer 108.

Figure 4:
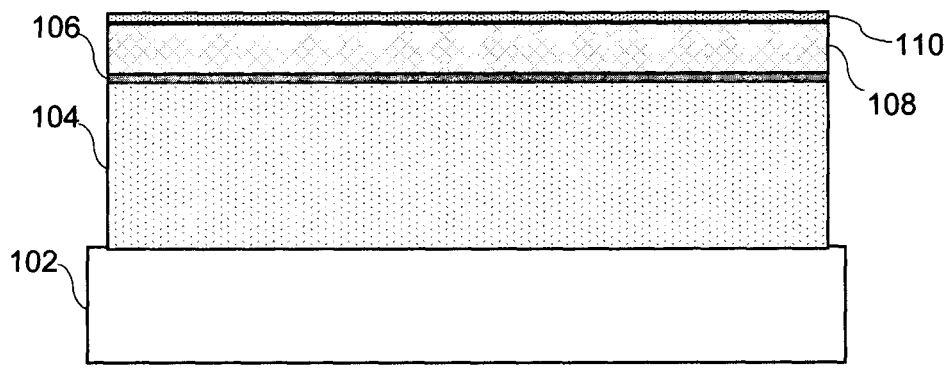
FIG. 4 is a cross-sectional diagram illustrating a p-type molybdenum trioxide (MoO3) interlayer formed on the chalcogen absorber layer according to an embodiment of the present invention.

In FIG. 4, according to an exemplary embodiment of the present invention, a p-type molybdenum trioxide ($MoO_3$) interlayer 110 is formed on the chalcogen absorber layer 108. The p-type molybdenum trioxide ($MoO_3$) interlayer 110 can be deposited through vacuum evaporation, chemical bath deposition, electrochemical deposition, atomic layer deposition, successive ionic layer absorption and reaction (SILAR), chemical vapor deposition, sputtering, spin coating, doctor blading, physical vapor deposition or any other suitable technique that would be apparent to one of skill in the art. The thickness of the p-type molybdenum trioxide ($MoO_3$) layer 110 is from about 2 nm to about 200 nm with a preferred thickness of about 20 nm to about 60 nm and an optimal thickness of about 20 nm.

Figure 5:
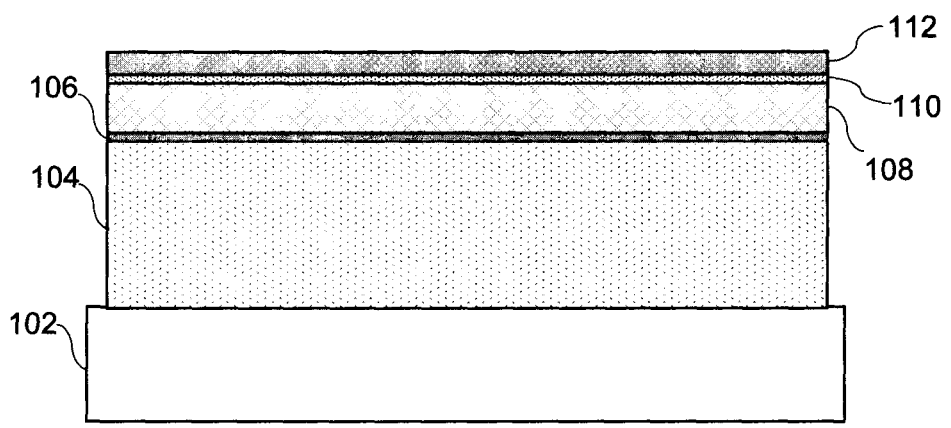
FIG. 5 is a cross-sectional diagram illustrating a conductive metal layer formed on the p-type interlayer according to an embodiment of the present invention.

In FIG. 5, according to an exemplary embodiment of the present invention, a conductive layer 112 is deposited on the p-type interlayer 110. The conductive layer 112 can be: (1) carbon materials such as graphite, graphene, nanotubes; (2) metals and their alloys such as gold, silver, copper, platinum, palladium; Zn, Ni, Co, Mo, Fe V, Cr, Sn, W, Mo, Ti, Mg; and (3) conductive oxides such as fluoride doped tin oxide (FTO), indium doped tin oxide (ITO) and aluminum doped zinc oxide (ZnO:Al). The conductive layer 112 can be deposited through vacuum evaporation, chemical bath deposition, electrochemical deposition, atomic layer deposition, successive ionic layer absorption and reaction (SILAR), chemical vapor deposition, sputtering, spin coating, doctor blading, physical vapor deposition or any other suitable technique that would be apparent to one of skill in the art. The thickness of the conductive layer 112 is preferably from about 2 nm to about 200 nm. The device is annealed at a temperature, pressure, and length of time sufficient to form the structure of the photovoltaic device.

With regard to the p-type molybdenum trioxide ($MoO_3$) interlayer, the work function of a metal is the minimum energy needed to remove an electron from a solid to a point in the vacuum immediately outside the solid surface. Here, the p-type molybdenum trioxide ($MoO_3$) interlayer has a work function of ~5.3 eV. In photovoltaic cells, increasing the work function of the conductive layer correlates positively to an increase in open circuit voltage ($V_{oc}$) and short circuit current ($J_{sc}$). The conductive layer and the p-type molybdenum trioxide ($MoO_3$) interlayer effectively accomplishes this as shown in Table 1.

The photovoltaic device according to the present invention produces higher efficiency (Eff), fill factor (FF), open circuit voltage ($V_{oc}$), and short circuit current ($J_{sc}$) as compared to traditional photovoltaic devices that use highly pure chalcogen absorber layer. As shown below, in Table 1, the present invention has higher efficiency (Eff), fill factor (FF), open circuit voltage ($V_{oc}$), and short circuit current ($J_{sc}$) using different transparent conductive oxides (FTO, ITO) and n-type layers ($TiO_2$, ZnO) as compared to traditional photovoltaic devices that use highly pure chalcogen absorber layers. The data of the aged device was taken at least one month after the initial measurement and shows a further increase in efficiency (Eff), open circuit voltage ($V_{oc}$), and short circuit current ($J_{sc}$).

TABLE 1

| | Efficiency (%) | Fill Factor (%) | $V_{OC}$ (mV) | $J_{SC}$ $\left(\frac{mA}{cm^2}\right)$ |
|---|---|---|---|---|
| FTO/TiO2/Se/Au | 4.65 | 50.5 | 728 | 12.6 |
| FTO/TiO2/Se/MoO3/Au | 6.85 | 60.6 | 866 | 13.1 |

TABLE 1-continued

|  | Efficiency (%) | Fill Factor (%) | $V_{OC}$ (mV) | $J_{SC}$ $\left(\frac{mA}{cm^2}\right)$ |
|---|---|---|---|---|
| FTO/TiO2/Se/MoO$_3$/Au, aged | 7.27 | 60.2 | 875 | 13.8 |
| FTO/ZnO/Se/Au | 4.81 | 50.5 | 748 | 12.7 |
| FTO/ZnO/Se/MoO$_3$/Au | 5.90 | 59.1 | 755 | 13.2 |
| ITO/ZnO/Se/Au | 4.35 | 49.6 | 672 | 13.1 |
| ITO/ZnO/Se/MoO$_3$/Au | 6.08 | 59.0 | 758 | 13.6 |

Figure 6:
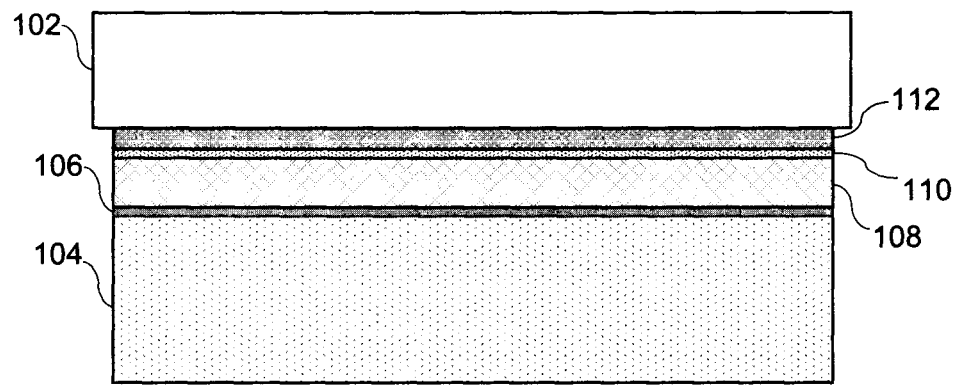
FIG. 6 is a cross-sectional diagram illustrating a photovoltaic device in a superstrate configuration according to an embodiment of the present invention.

In FIG. 6, another embodiment of the present invention is shown where a superstrate is used instead of a substrate. The method for fabricating the superstrate configuration of the present invention includes: forming a conductive layer 112 on a transparent superstrate 102; forming a p-type molybdenum trioxide (MoO3) interlayer 110 on the conductive layer 112; forming a chalcogen absorber layer 108 on the p-type molybdenum trioxide (MoO3) interlayer 110; forming an n-type layer 106 on the chalcogen absorber layer 108; forming a transparent conductive electrode layer 104 on the n-type layer 106; and annealing at a temperature, pressure, and length of time sufficient to form the structure of the photovoltaic device. Furthermore, the optional tellurium adhesion layer (not shown) can be deposited on the p-type molybdenum trioxide (MoO$_3$) layer 110 before deposition of the chalcogen absorber layer 108. The materials and thickness of the layers for the superstrate configuration of the present invention are the same as the substrate configuration.

Figure 7:
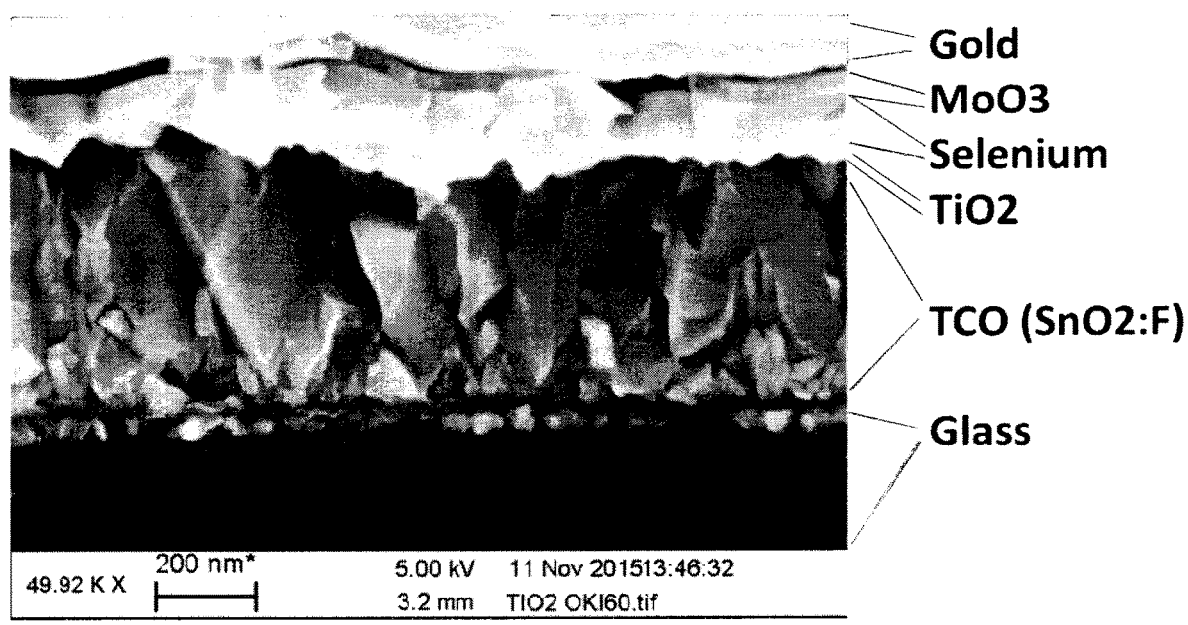
FIG. 7 is a scanning electron micrograph (SEM) image of a photovoltaic device according to an embodiment of the present invention.

FIG. 7 shows a scanning electron micrograph of the device structure of the present invention. The embodiment shown in FIG. 7 is the substrate configuration of the present invention where the substrate used is glass material. In this embodiment, the transparent conductive layer is fluorine doped tin oxide, the n-type layer is titanium dioxide, the chalcogen absorber layer is selenium, and gold is used as the conductive layer. The optional tellurium adhesion layer was not used in forming the device shown in FIG. 7.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a photovoltaic device, comprising the steps of:
   forming a transparent conductive electrode layer as a layer of a transparent conductive oxide material directly on a transparent substrate;
   forming an n-type layer directly on the transparent conductive electrode layer;
   forming a chalcogen absorber layer on the n-type layer;
   forming a p-type interlayer of molybdenum trioxide (MoO$_3$) directly on the chalcogen absorber layer, wherein the chalcogen absorber layer separates the p-type interlayer from the n-type layer;
   forming a conductive layer directly on the p-type interlayer wherein the only chalcogen present in the chalcogen absorber layer is selenium, and wherein the chalcogen absorber layer has a thickness from about 25 nm to about 200 nm; and
   annealing at a temperature, pressure, and length of time to form a structure of the photovoltaic device.

2. The method according to claim 1, wherein the transparent conductive oxide material is selected from the group consisting of: fluoride doped tin oxide (FTO), indium doped tin oxide (ITO) and aluminum doped zinc oxide (ZnO:Al).

3. The method according to claim 1, wherein the n-type layer is zinc dioxide.

4. The method according to claim 1, further comprising the step of:
   forming a tellurium (Te) adhesion layer between the n-type layer and the chalcogen absorber layer.

5. The method according to claim 1, wherein the n-type layer has a thickness from about 2 nm to about 200 nm.

6. The method according to claim 1, wherein the n-type layer has a thickness from about 30 nm to about 60 nm.

7. The method according to claim 1, wherein the chalcogen absorber layer has a thickness from about 80 nm to about 120 nm.

8. The method according to claim 1, wherein the transparent substrate comprises a plastic or ceramic substrate, and wherein the method further comprises the step of:
   polishing the transparent substrate.

9. The method according to claim 1, wherein the conductive layer comprises a carbon material selected from the group consisting of: graphite, graphene, and combinations thereof.

\* \* \* \* \*